United States Patent
Chou et al.

(10) Patent No.: US 10,666,235 B1
(45) Date of Patent: May 26, 2020

(54) TEMPERATURE COMPENSATED OSCILLATION CIRCUIT

(71) Applicants: Chia-Yuan Chou, Hsinchu (TW); An-Chi Tsai, Taipei (TW)

(72) Inventors: Chia-Yuan Chou, Hsinchu (TW); An-Chi Tsai, Taipei (TW)

(73) Assignee: ITE Tech. Inc., Hsinchu (TW)

( * ) Notice: Subject to any disclaimer, the term of this patent is extended or adjusted under 35 U.S.C. 154(b) by 0 days.

(21) Appl. No.: 16/507,059

(22) Filed: Jul. 10, 2019

(30) Foreign Application Priority Data

Apr. 2, 2019  (TW) ............................. 108111594 A

(51) Int. Cl.
  *H03K 3/0231* (2006.01)
  *H03K 4/501* (2006.01)
  *H03K 3/011* (2006.01)
(52) U.S. Cl.
  CPC ........... *H03K 3/0231* (2013.01); *H03K 3/011* (2013.01); *H03K 4/501* (2013.01)
(58) Field of Classification Search
  CPC ........ H03K 3/0231; H03K 4/50; H03K 4/501; H03K 3/011; H03L 1/02
  See application file for complete search history.

(56) References Cited

U.S. PATENT DOCUMENTS

| | | | |
|---|---|---|---|
| 6,078,208 A | 6/2000 | Nolan et al. | |
| 7,385,453 B2 * | 6/2008 | Nervegna | ............... H03K 3/011 331/111 |
| 9,306,493 B2 * | 4/2016 | Schatzberger | ......... H03K 4/501 |
| 10,483,948 B2 * | 11/2019 | Sun | ........................... H03B 5/24 |
| 2010/0066457 A1 | 3/2010 | Muller | |
| 2013/0038364 A1 | 2/2013 | Tokairin | |
| 2015/0171791 A1 | 6/2015 | Schatzberger | |
| 2015/0194929 A1 | 7/2015 | Tokairin | |

(Continued)

FOREIGN PATENT DOCUMENTS

| | | |
|---|---|---|
| TW | 201525428 | 7/2015 |
| TW | 201624925 | 7/2016 |

OTHER PUBLICATIONS

Yusuke Tokunaga et al., "An On-Chip CMOS Relaxation Oscillator With Voltage Averaging Feedback," IEEE Journal of Solid-State Circuits, vol. 45, Issue 6, Jun. 2010, pp. 1150-1158.

(Continued)

*Primary Examiner* — Ryan Johnson
(74) *Attorney, Agent, or Firm* — JCIPRNET

(57) ABSTRACT

A temperature compensated oscillation circuit is provided. The temperature compensated oscillation circuit generates a first delay voltage and a second delay voltage according to the first resistance value. A first order term of a temperature change function of the first resistance value is eliminated. The temperature compensated oscillation circuit generates a reference voltage according to a first reference resistance value and a second reference resistance value. A first order term of a temperature change function of the first reference resistance value is set to equal to a first order term of a temperature change function of the second reference resistance value. The second reference resistance value is adjusted such that variation of the reference voltage matches a second order term of the temperature change function of the first resistance value, thereby providing a clock that does not vary due to a variation in temperature.

10 Claims, 5 Drawing Sheets

(56) References Cited

U.S. PATENT DOCUMENTS

2016/0013753 A1     1/2016   Tam et al.
2018/0152140 A1     5/2018   Chen et al.
2018/0351538 A1*   12/2018   Tanaka ................... H03K 4/08

OTHER PUBLICATIONS

Office Action of Taiwan Counterpart Application, dated Apr. 30, 2019, pp. 1-4.

* cited by examiner

TEMPERATURE COMPENSATED OSCILLATION CIRCUIT

CROSS-REFERENCE TO RELATED APPLICATION

This application claims the priority benefit of Taiwan application serial no. 108111594, filed on Apr. 2, 2019. The entirety of the above-mentioned patent application is hereby incorporated by reference herein and made a part of this specification.

BACKGROUND OF THE INVENTION

Field of the Invention

The invention is related to an oscillation circuit, and more particularly to a temperature compensated oscillation circuit.

Description of Related Art

The clock frequency generated by common RC oscillators varies due to a variation in temperature. A capacitance value does not vary due to a variation in temperature, and the resistance value is more sensitive to the variation in temperature. It is recited in the disclose of "An On-Chip CMOS Relaxation Oscillator With Voltage Averaging Feedback" that the resistance of RC oscillators is coupled in series with a diffusion resistance having a positive temperature change function through a polysilicon resistor having a negative temperature change function, such that the clock frequency generated by the RC oscillators is less sensitive to temperature.

However, the temperature change function may be regarded as a Taylor expansion having at least a first order term and a second order term. With the aforementioned methods, merely the first order term of the temperature change function is eliminated, but the second order term of the temperature change function is still existed. Therefore, the clock frequency still varies due to a variation in temperature. The second order term of the temperature change function fails to be eliminated by a diffusion resistance of the polysilicon resistor coupled in series. As shown in FIG. 1, FIG. 1 is a diagram of a relative change in clock frequency and temperature when the second order term of the temperature change function is retained. The horizontal axis in the relationship diagram F1 is illustrated as temperature. The vertical axis in the relationship diagram F1 is illustrated as the relative change in the clock frequency. The relative change in clock frequency is illustrated as a percentage. In FIG. 1, a relative curve CV1 is illustrated as a curved second order function. Although the first order term of the temperature change function is eliminated, the second order term of the temperature change function is still existed. It may be acquired from FIG. 1 that there is still a 2% relative change in the clock frequency in the temperature range of −40° C. to 100° C. Thus, the temperature change function still having the second order term leads to the clock frequency of the common RC oscillators varying due to the variation in temperature.

SUMMARY OF THE DISCLOSURE

A temperature compensated oscillation circuit of the invention is configured to generate a clock that has a clock frequency not varying due to variation in temperature.

The temperature compensated oscillation circuit of the invention includes a first delay voltage generator, a second delay voltage generator, a reference voltage generator, and a clock generating circuit. The first delay voltage generator is configured to generate the first delay voltage according to a first clock, a first resistance value, and a first capacitance value. A first order term of a temperature change function of the first resistance value is eliminated. The second delay voltage generator is configured to generate the second delay voltage according to a second clock, the first resistance value, and a second capacitance value. The reference voltage generator is configured to receive an external power supply. The reference voltage generator divides the external power supply to generate a reference voltage according to the first resistance value and a second resistance value. The first order term of the temperature change function of the first reference resistance value is set to be equal to the first order term of the temperature change function of the second reference resistance value. The second resistance value is adjusted such that the variation of the reference voltage matches a second order term of the temperature change function of the first resistance value. The clock generating circuit is configured to generate the first clock according to the first delay voltage and the reference voltage, and generate the second clock according to the second delay voltage and the reference voltage.

In view of the above, in the first delay voltage generator and the second delay voltage generator, the first order term of the temperature change function of the first resistance value is eliminated. In the reference voltage generator, the first order term of the temperature change function of the first reference resistance value is set to be equal to the first order term of the temperature change function of the second reference resistance value. Besides, the second resistance value is adjusted, such that variation of the reference voltage matches the second order term of the temperature change function of the first resistance value. The first delay voltage and the second delay voltage varies due to the second order term of the temperature change function of the first resistance value. Therefore, the variation of the reference voltage is equal to the variation of the first delay voltage and the second delay voltage. As such, the frequency of the first clock and the second clock does not vary due to a variation in temperature.

To provide a further understanding of the aforementioned and other features and advantages of the disclosure, exemplary embodiments, together with the reference drawings, are described in detail below.

DESCRIPTION OF THE EMBODIMENTS

Figure 2:
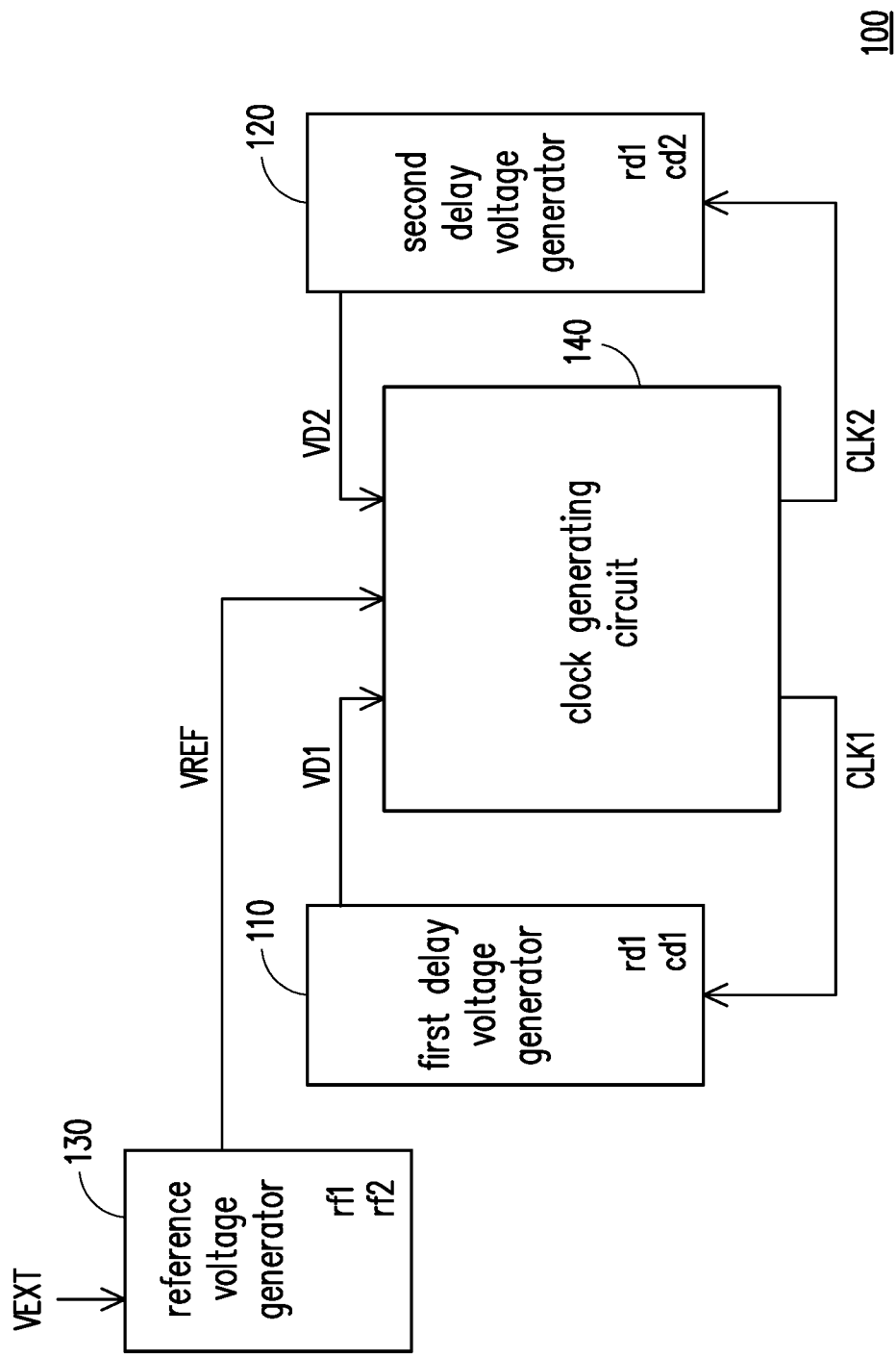
FIG. 2 is a schematic diagram according to a temperature compensated oscillation circuit illustrated in the first embodiment of the invention.

Please refer to FIG. 2. FIG. 2 is a schematic diagram according to a temperature compensated oscillation circuit illustrated in the first embodiment of the invention. In this embodiment, the temperature compensated oscillation circuit 100 includes a first delay voltage generator 110, a second delay voltage generator 120, a reference voltage generator 130, and a clock generating circuit 140. The first delay voltage generator 110 is configured to generate a first delay voltage VD1 according to a first clock CLK1, the first resistance value rd1, and a first capacitance value cd1 The first resistance value rd1 has a temperature change function. The temperature change function is illustrated as a Taylor expansion having at least a first order term and a second order term. The first delay voltage generator 110 further eliminates the first order term of the temperature change function. The second delay voltage generator 120 is configured to generate a second delay voltage VD2 according to a second clock CLK2, the first resistance value rd1, and a second capacitance value cd2. Likewise, in the second delay voltage generator 120, the first order term of the temperature change function is also eliminated. After the first order term of the temperature change function is eliminated, the second order term of the temperature change function is retained.

In this embodiment, the reference voltage generator 130 receives an external power supply VEXT. The reference voltage generator 130 converts the external power supply VEXT to a reference voltage VREF according to a first resistance value rf1 and a second resistance value rf2. The first resistance value rf1 has a temperature change function. The second resistance value rf2 has a temperature change function. Similar to the temperature change function of the first resistance value rd1, a temperature change function of the first resistance value rf1 and a temperature change function of the second resistance value rf2 are illustrated as a Taylor expansion function having at least the first order term and the second order term. In the reference voltage generator 130, a first order term of a temperature change function of the first resistance value rf1 is set to be equal to a first order term of a temperature change function of the second resistance value rf2. Besides, the second resistance value rf2 is adjusted, such that a variation of the reference voltage VREF matches a second order term of the temperature change function of the first resistance value rd1. The clock generating circuit 140 generates the first clock CLK1 according to the first delay voltage VD1 and the reference voltage VREF, and generates the second clock CLK2 according to the second delay voltage VD2 and the reference voltage VREF.

It should be noted that, in the first delay voltage generator 110 and the second delay voltage generator 120, the first order term of temperature change function of the first resistance value rd1 is eliminated. In the reference voltage generator 130, the first order term of temperature change function of the first resistance value rd1 is set to be equal to the first order term of temperature change function of the second resistance value rf2. Furthermore, the second resistance value rf2 is adjusted, such that variation of the reference voltage VREF matches the second order term of the temperature change function of the first resistance value rd1. The first delay voltage VD1 and the second delay voltage VD2 varies due to the variation of the second order term (as the relationship curve CV1 illustrated in FIG. 1) of the temperature change function of the first resistance value rd1. Therefore, the variation of the reference voltage VREF is equal to the variation of the first delay voltage VD1 and a second delay voltage VD2. As such, the frequency of the first clock CLK1 and the second clock CLK2 does not vary due to the variation in temperature.

Figure 3:
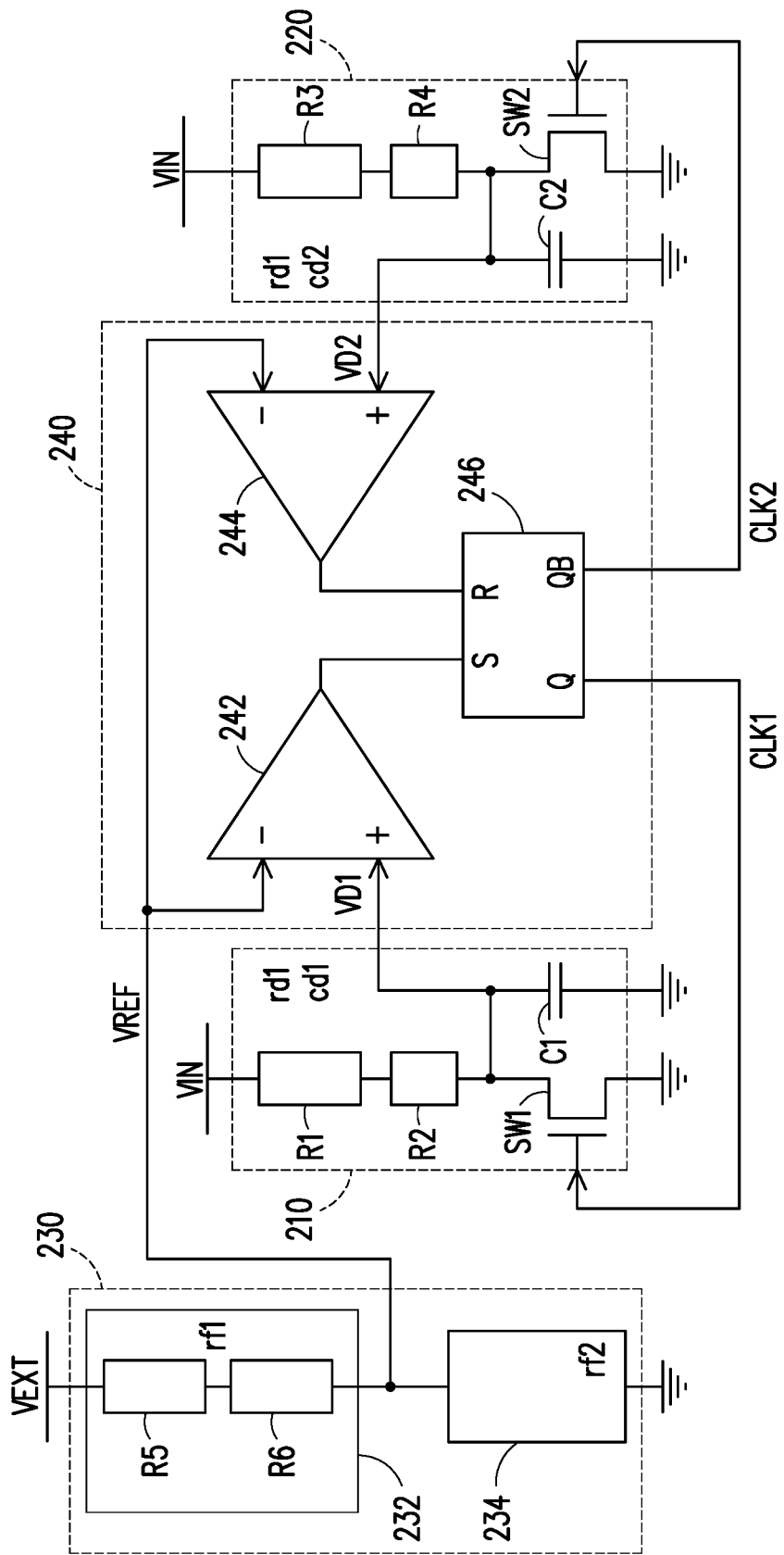
FIG. 3 is a schematic diagram according to a temperature compensated oscillation circuit illustrated in the second embodiment of the invention.

Furthermore, please refer to FIG. 3. FIG. 3 is a schematic diagram according to a temperature compensated oscillation circuit illustrated in the second embodiment of the invention. In this embodiment, a temperature compensated oscillation circuit 200 includes a first delay voltage generator 210, a second delay voltage generator 220, a reference voltage generator 230 and a clock generating circuit 240. The coupling relationship between the first delay voltage generator 210, the second delay voltage generator 220, the reference voltage generator 230, and the clock generating circuit 240 may be acquired from the enough teachings in the first embodiment, and shall not be repeated herein.

In this embodiment, the first delay voltage generator 210 includes a first resistor R1, a second resistor R2, a first capacitor C1 and a first switch SW1. A first terminal of the first resistor R1 is configured to receive an input voltage VIN. A first terminal of the second resistor R2 is coupled to a second terminal of the first resistor R1. That is, the first resistor R1 and the second resistor R2 are serially connected. The first resistor R1 and the second resistor R2 commonly provide the first resistance value rd1. A temperature coefficient of one of the first resistor R1 and the second resistor R2 is a negative temperature coefficient. A temperature coefficient of the other of the first resistor R1 and the second resistor R2 is a positive temperature coefficient. The aforementioned negative temperature coefficient illustrates that the constant of the first order term of the temperature change function is a real number less than 0, whereas the positive temperature coefficient is a real number greater than 0. For example, the temperature coefficient of the first resistor R1 is a negative temperature coefficient, and the temperature coefficient of the second resistor R2 is a positive temperature coefficient. Therefore, after the temperature change function of the resistance value of the first resistor R1 and the temperature change function of the resistance value of the second resistor R2 is acquired, (the temperature change function provided by manufacturers), the length of the first resistor R1 and the length of the second resistor R2 are adjusted according to the constant of the first order term, such that the first order term of the temperature change function of the first resistance value rd1 is eliminated. For instance, the first resistor R1 is a negative temperature coefficient. The temperature change function of the resistance value of the first resistor R1 is illustrated as in Formula (1).

$$FR1(T) = -0.8 \times T + 0.01 \times T^2 \qquad \text{Formula (1)}$$

FR1(T) is indicated as a temperature change function of the first resistance value of the first resistor R1, and T is indicated as temperature. A temperature coefficient of the second resistor R2 is a positive temperature coefficient. The temperature change function of the resistance value of the second resistor R2 is illustrated as in Formula (2):

$$FR2(T) = 2.4 \times T + 0.08 \times T^2 \qquad \text{Formula (2)}$$

FR2(T) is indicated as a temperature change function of the first resistance value of the second resistor R2. It may be acquired from Formula (1) and Formula (2) that the length of the first resistor R1 may be set as three times longer than that of the second resistor R2. As such, the first order term of the temperature change function of the first resistance value rd1 is eliminated, and the second order term of the temperature change function of the first resistance value rd1 is retained (that is, $3 \times FR1(T) + FR2(T) = 0.11 \times T^2$).

A first terminal of the first capacitor C1 is coupled to a second terminal of the second resistor R2. A second terminal of the first capacitor C1 is coupled to a reference low voltage (for example, a ground). The first capacitor C1 provides the first capacitance value cd1. The first delay voltage generator 210 provides the first delay voltage VD1 through the second resistor R2 and a connection node of the first capacitor C1.

A first terminal of the first switch SW1 is coupled to a second terminal of the second resistor R2 and the first terminal of the first capacitor C1. The second terminal of the first switch SW1 is coupled to the reference low voltage. A control terminal of the first switch SW1 is configured to receive the first clock CLK1. In this embodiment, the first switch SW1 may be realized by, for example, an N-type metal-oxide-semiconductor (MOS) field effect transistor. The first switch SW1 switches under the control of the first clock CLK1. When the first switch SW1 is turned off, the input voltage VIN charges the first capacitor C1 through the first resistor R1 and the second resistor R2, such that the first delay voltage VD1 is formed on the second resistor R2 and the connection node of the first capacitor C1. When the first switch SW1 is turned on, the voltage value of the first delay voltage VD1 is pulled down to the reference low voltage level (for example, 0 volt).

In this embodiment, the second delay voltage generator 220 includes a third resistor R3, a fourth resistor R4, a second capacitor C2 and a second switch SW2. A first terminal of the third resistor R3 is configured to receive the input voltage VIN. A first terminal of fourth resistor R4 is coupled to a second terminal of the third resistor R3. In other words, the third resistor R3 and the fourth resistor R4 are serially connected. The third resistor R3 and the fourth resistor R4 commonly provide the first resistance value rd1. A temperature coefficient of one of the third resistor R3 and the fourth resistor R4 is a negative temperature coefficient. A temperature coefficient of the other of the third resistor R3 and the fourth resistor R4 is a positive temperature coefficient. The second delay voltage generator 220 eliminates the first order term of the temperature change function of the first resistance value rd1 through the third resistor R3 and the fourth resistor R4. The implementing details that the first order term of the temperature change function of the first resistance value rd1 is eliminated through the third resistor R3 and the fourth resistor R4 may be acquired enough teachings from the implementing details that the implementing details that the first order term of the temperature change function of the first resistance value rd1 is eliminated through the first resistor R1 and the second resistor R2, and shall not be repeated herein. In this embodiment, materials of the third resistor R3 may be equal to the materials of the first resistor R1. The materials of the fourth resistor R4 may be equal to the materials of the second resistor R2. As such, the design complexity of the first delay voltage generator 210 and the second delay voltage generator 220 may be lowered.

A first terminal of the second capacitor C2 is coupled to a second terminal of the fourth resistor R4. A second terminal of the second capacitor C2 is coupled to the reference low voltage. The second capacitor C2 is configured to provide the second capacitance value cd2. The second delay voltage generator 220 provides the second delay voltage VD2 through the fourth resistor R4, and a connection node of the second capacitor C2. In this embodiment, the first capacitance value cd1 is not equal to the second capacitance value cd2.

A first terminal of second switch SW2 is coupled to a second terminal of the fourth resistor R4 and a first terminal of the second capacitor C2. A second terminal of the second switch SW2 is coupled to the reference low voltage. A control terminal of the second switch SW2 is configured to receive the second clock CLK2. In this embodiment, the implementation method of the second switch SW2 is similar to that in the first switch SW1. The second switch SW2 may be realized by, for example, NMOS. The second switch SW2 switches under the control of the second clock CLK2. When the second switch SW2 is turned off, the input voltage VIN charges the second capacitor C2 through the third resistor R3 and the fourth resistor R4, such that the second delay voltage VD2 is formed through the fourth resistor R4 and the connection node of the second capacitor C2. When the second switch SW2 is turned on, a voltage value of the second delay voltage VD2 is pulled down to the reference low voltage level (for example, 0 volt). The first switch and the second switch of this invention may be realized by any element having the same form of transistor switch. However, the realization method of the first switch and the second switch of this invention is not limited to this embodiment.

In this embodiment, a reference voltage generator 230 includes a first reference circuit 232 configured to provide the first resistance value rf1 and a second reference circuit 234 configured to provide the second resistance value rf2. The first terminal of the first reference circuit 232 is configured to receive the external power supply VEXT. A second terminal of the first reference circuit 232 is coupled to the clock generating circuit 240. The first reference circuit 232 includes a first reference resistor R5 and a second reference resistor R6. A first terminal of the first reference resistor R5 is configured as the first terminal of the first reference circuit 232, and is configured to receive the external power supply VEXT. A first terminal of the second reference resistor R6 is coupled to a second terminal of the first reference resistor R5. A second terminal of the second reference resistor R6 is coupled to the second reference circuit 234. The second terminal of the second reference resistor R6 is configured to receive the second terminal of the first reference circuit 232. In this embodiment, a temperature coefficient of one of the first reference resistor R5 and the second reference resistor R6 is a negative temperature coefficient. A temperature coefficient of the other of the first reference resistor R5 and the second reference resistor R6 is a positive temperature coefficient. For example, a temperature coefficient of the first reference resistor R5 is a negative temperature coefficient. A temperature coefficient of the second reference resistor R6 is a positive temperature coefficient. The first reference resistor R5 and the second reference resistor R6 are serially connected to provide the first resistance value rf1. The temperature change function of the first resistance value rf1 includes the first order term and the second order term.

In this embodiment, the second reference circuit 234 is coupled between the first reference circuit 232 and the reference low voltage. The temperature change function of the second resistance value rf2 includes the first order term and the second order term. The first reference resistor R5 and the second reference resistor R6 are designed, such that the first order term of the temperature change function of the first resistance value rf1 is equal to the first order term of the temperature change function of the second resistance value rf2. As such, the reference voltage VREF generated by dividing the external power supply VEXT does not vary due to a variation in temperature of the first order term of temperature change function of the first resistance value rf1 and the first order term of the temperature change function of the second resistance value rf2. The reference voltage VREF generated by the reference voltage generator 230 varies due to a variation in temperature of the second order term of the temperature change function of the first resistance value rf1 and the second order term of the temperature change function of the second resistance value rf2.

In this embodiment, the second resistance value rf2 is adjusted, such that variation of the reference voltage VREF matches the second order term of the temperature change function of the first resistance value rd1.

Figure 4B:
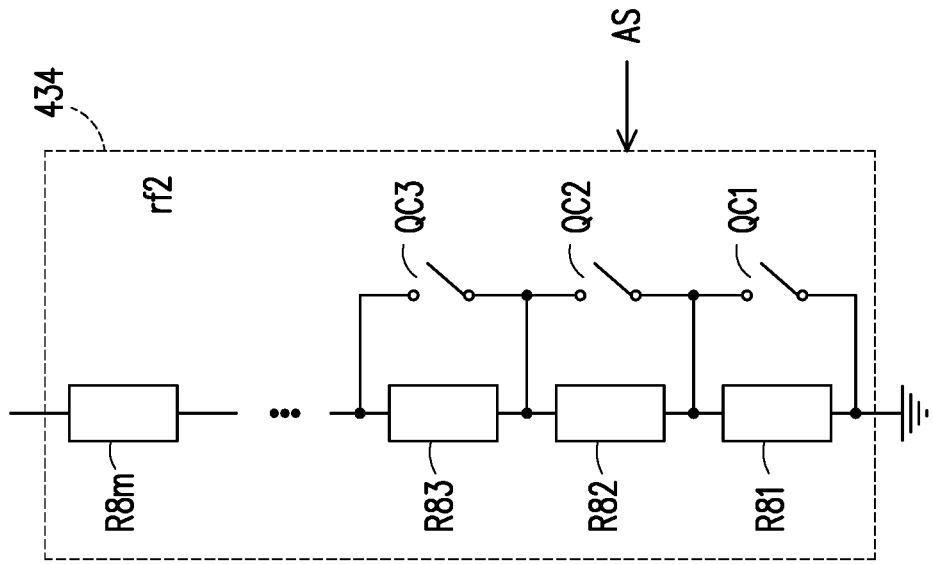
FIG. 4B is a schematic diagram according to a second reference circuit illustrated in another embodiment of the invention.
Figure 4A:
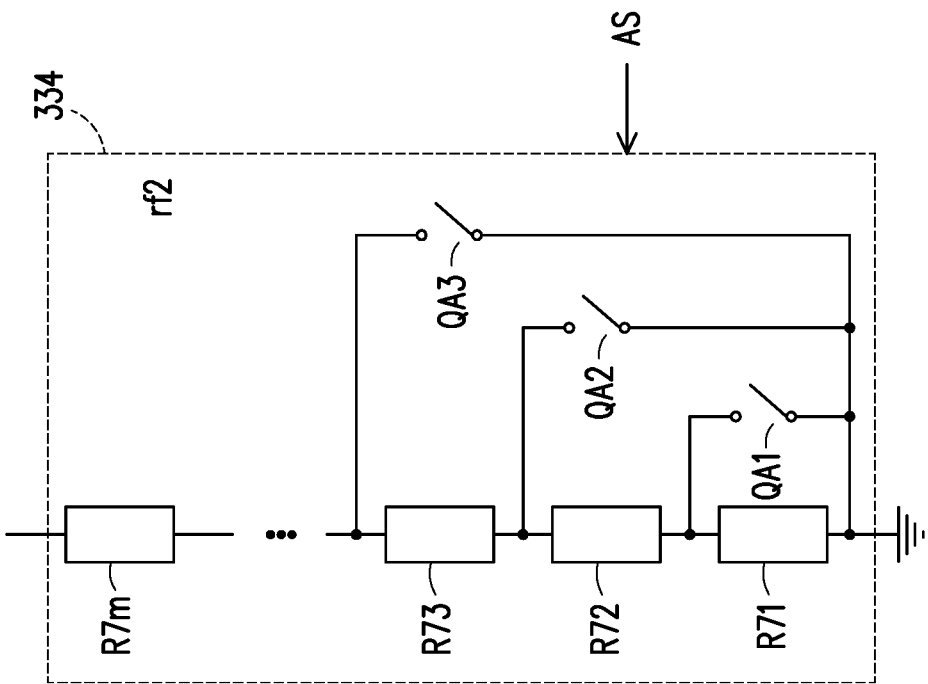
FIG. 4A is a schematic diagram according to a second reference circuit illustrated in an embodiment of the invention.

Regarding the implementing details of the second resistance value, please refer to FIG. 4A. FIG. 4A is a schematic diagram according to a second reference circuit illustrated in an embodiment of the invention. In this embodiment, a second reference circuit 334 includes third reference resistors R71-R7m and adjusting switches QA1-QA3. The third reference resistors R71-R7m are serially connected and are coupled between the first reference circuit (for example, the first reference circuit 232 of FIG. 3) and the reference low voltage. The adjusting switches QA1-QA3 are respectively connected in parallel with at least one of the third reference resistors R71-R7m. The second reference circuit 334 may control the adjusting switches QA1-QA3 according to the adjusting signal AS, so as to adjust the second resistance value rf2. For instance, a first terminal of the adjusting switch QA1 is coupled to a first terminal of the third reference resistor R71. A second terminal of the adjusting switch QA1 is coupled to the reference low voltage. A first terminal of the adjusting switch QA2 is coupled to a first terminal of the third reference resistor R72. A second terminal of the adjusting switch QA2 is coupled to the reference low voltage. A first terminal of the adjusting switch QA3 is coupled to a first terminal of the third reference resistor R73. A second terminal of the adjusting switch QA3 is coupled to the reference low voltage. For example, the second reference circuit 334 turns on the adjusting switch QA2 and turns off the adjusting switch QA3 according to the three-digit adjusting signal AS to bypass the third reference resistors R71, R72, so as to adjust the second resistance value rf2. For easier illustration, the quantity of the adjusting switch of the embodiment is an example of the quantity of 3. The quantity of the adjusting switch of the invention may be plural, and may not be limited by this embodiment.

Please refer to FIG. 4B. FIG. 4B is a schematic diagram according to a second reference circuit illustrated in another embodiment of the invention. In this embodiment, a second reference circuit 434 includes third reference resistors R81-R8m and adjusting switches QC1-QC3. The third reference resistors R81-R8m are serially connected and are coupled between the first reference circuit (as the first reference circuit 232 illustrated in FIG. 3) and the reference low voltage. The adjusting switches QC1-QC3 are respectively connected in parallel with one of the third reference resistors R81-R8m. The second reference circuit 434 controls the adjusting switches QC1-QC3 according to the adjusting signal AS so as to adjust the second resistance value rf2. For example, a first terminal of the adjusting switch QC1 is coupled to a first terminal of the third reference resistor R81. A second terminal of the adjusting switch QC1 is coupled to a second terminal of the third reference resistor R81. A first terminal of the adjusting switch QC2 is coupled to a first terminal of the third reference resistor R82. A second terminal of the adjusting switch QC2 is coupled to a second terminal of the third reference resistor R82. A first terminal of adjusting switch QC3 is coupled to a first terminal of the third reference resistor R83. A second terminal of the adjusting switch QC3 is coupled to a second terminal of the third reference resistor R83. For example, the second reference circuit turns on the adjusting switches QC1, QC2, and turns off the adjusting switches QC3 according to the three-digit adjusting signal AS to bypass the third reference resistors R81, R82, so as to adjust the second resistance value rf2.

Please refer back to FIG. 3. In the embodiment of FIG. 3, the clock generating circuit 240 generates the first clock CLK1 according to the comparison of the reference voltage VREF and the first delay voltage VD1, and generates the second clock CLK2 according to the comparison of the reference voltage VREF and the second delay voltage VD2. In detail, the clock generating circuit 240 includes a first comparator 242, a second comparator 244, and a logic circuit 246. A non-inverting input terminal of the first comparator 242 is coupled to the reference voltage generator 230 to receive the reference voltage VREF. The non-inverting input terminal of the first comparator 242 is coupled to the first delay voltage generator 210 to receive the first delay voltage VD1. That is, the non-inverting input terminal of first comparator 242 is coupled to the second terminal of the first reference circuit 232 to receive the reference voltage VREF. The non-inverting input terminal of the first comparator 242 is coupled to the second resistor R2 and the connection node of the first capacitor C1 to receive the first delay voltage VD1. The first comparator 242 compares the voltage value of the reference voltage VREF and the voltage value of the first delay voltage VD1 to generate a first comparison result. The first comparator 242 provides the first comparison result to the logic circuit 246 through an output terminal.

A non-inverting input terminal of the second comparator 244 is coupled to the reference voltage generator 230 to receive the reference voltage VREF. A non-inverting input terminal of the second comparator 244 is coupled to the second delay voltage generator 220 to receive the second delay voltage VD2. In other words, the non-inverting input terminal of the second comparator 244 is coupled to the second terminal of the first reference circuit 232 to receive the reference voltage VREF. The non-inverting input terminal of the second comparator 244 is coupled to the fourth resistor R4 and the connection node of the second capacitor C2 to receive the second delay voltage VD2. The second comparator 244 compares the voltage value of the reference voltage VREF and the voltage value of the second delay voltage VD2 to generate a second comparison result.

The logic circuit 246 is coupled to the first comparator 242, the second comparator 244, the first delay voltage generator 210 and the second delay voltage generator 220, configured according to the first comparison result and the second comparison result generates the first clock CLK1 and the second clock CLK2. In this embodiment, the logic circuit 246 is realized by setting a SR latch. An input setting S of the logic circuit 246 is coupled to an output terminal of the first comparator 242 to receive the first comparison result. A reset input terminal R of the logic circuit 246 is coupled to an output terminal of the second comparator 244 to receive the second comparison result. The logic circuit 246 provides the first clock CLK1 to the first switch SW1 through an output terminal Q. The logic circuit 246 provides the second clock CLK2 to the second switch SW2 through an inverting output terminal QB.

For example, when the voltage value of the first delay voltage VD1 is greater than the voltage value of the reference voltage VREF, and the voltage value of the second delay voltage VD2 is smaller than the voltage value of the reference voltage VREF, the first comparator 242 provides the high logic level first comparison result, and the second comparator 244 provides the low logic level second comparison result. The logic circuit 246 provides the high logic level first clock CLK1 and the low logic level second clock CLK2 according to the first comparison result and the second comparison result. At this time, the first delay voltage generator 210 pulls down the voltage value of the first delay voltage VD1 to the reference low voltage level according to the first clock CLK1. The second delay voltage generator 220 further provides the second delay voltage VD2 according to the second clock CLK2. Afterwards, when the voltage value of the second delay voltage VD2 is greater than the voltage value of the reference voltage VREF, the logic circuit 246 provides the low logic level first clock CLK1 and the high logic level second clock CLK2. As such, the logic circuit 246 starts to provide the first clock CLK1 and the second clock CLK2 having clock frequency not varying due to a variation in temperature.

According to the teaching of the embodiment of FIG. 3, the temperature compensated oscillation circuit 200 may be further amended. In some embodiments, a non-inverting input terminal of the first comparator 242 is coupled to the reference voltage generator 230 to receive the reference voltage VREF. A non-inverting input terminal of the first comparator 242 is coupled to the first delay voltage generator 210 to receive the first delay voltage VD1. The non-inverting input terminal of the second comparator 244 is coupled to the reference voltage generator 230 to receive the reference voltage VREF. The non-inverting input terminal of the second comparator 244 is coupled to the second delay voltage generator 220 to receive the second delay voltage VD2. In some embodiments, a reset terminal R of the logic circuit 246 is coupled to the output terminal of the first comparator 242 to receive the first comparison result. A setting terminal S of the logic circuit 246 is coupled to the output terminal of the second comparator 244 to receive the second comparison result. The coupling method of the temperature compensated oscillation circuit of the invention is not limited to this embodiment.

Figure 1:
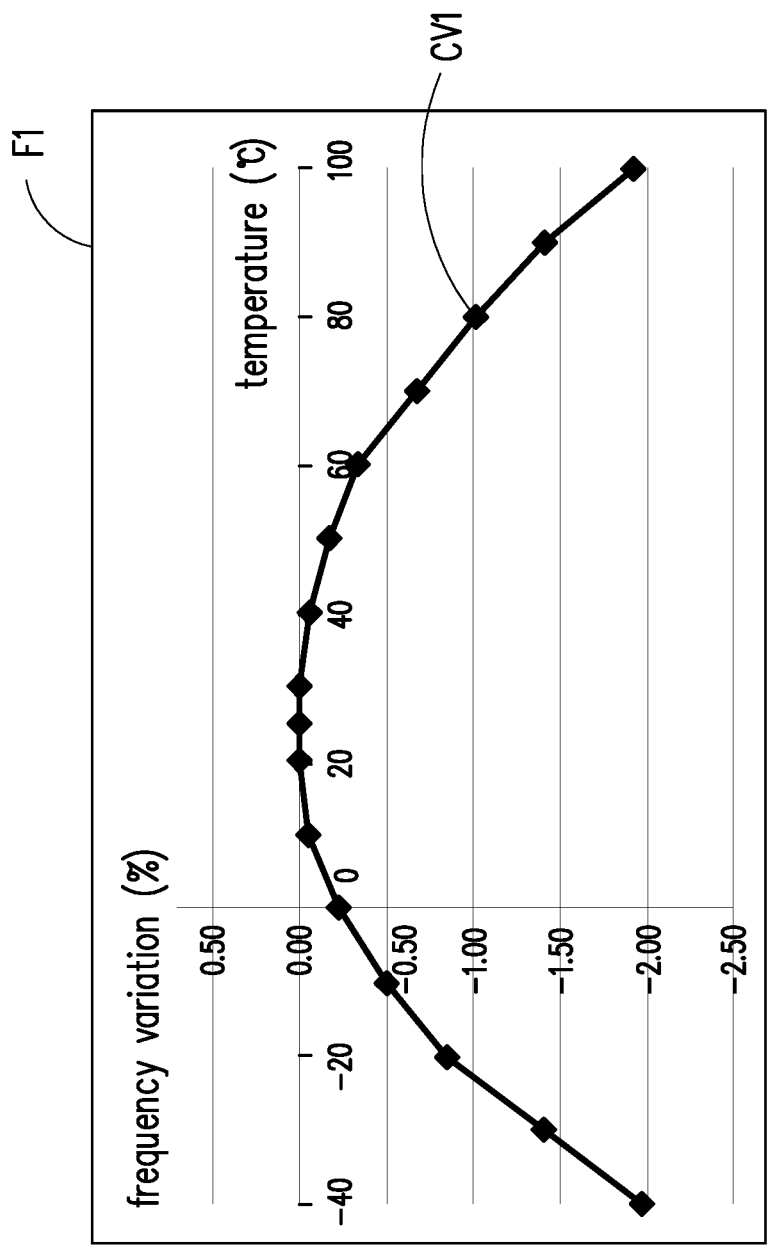
FIG. 1 is a relationship diagram of a relative change in clock frequency and temperature when the second order term of the temperature change function is retained.
Figure 5:
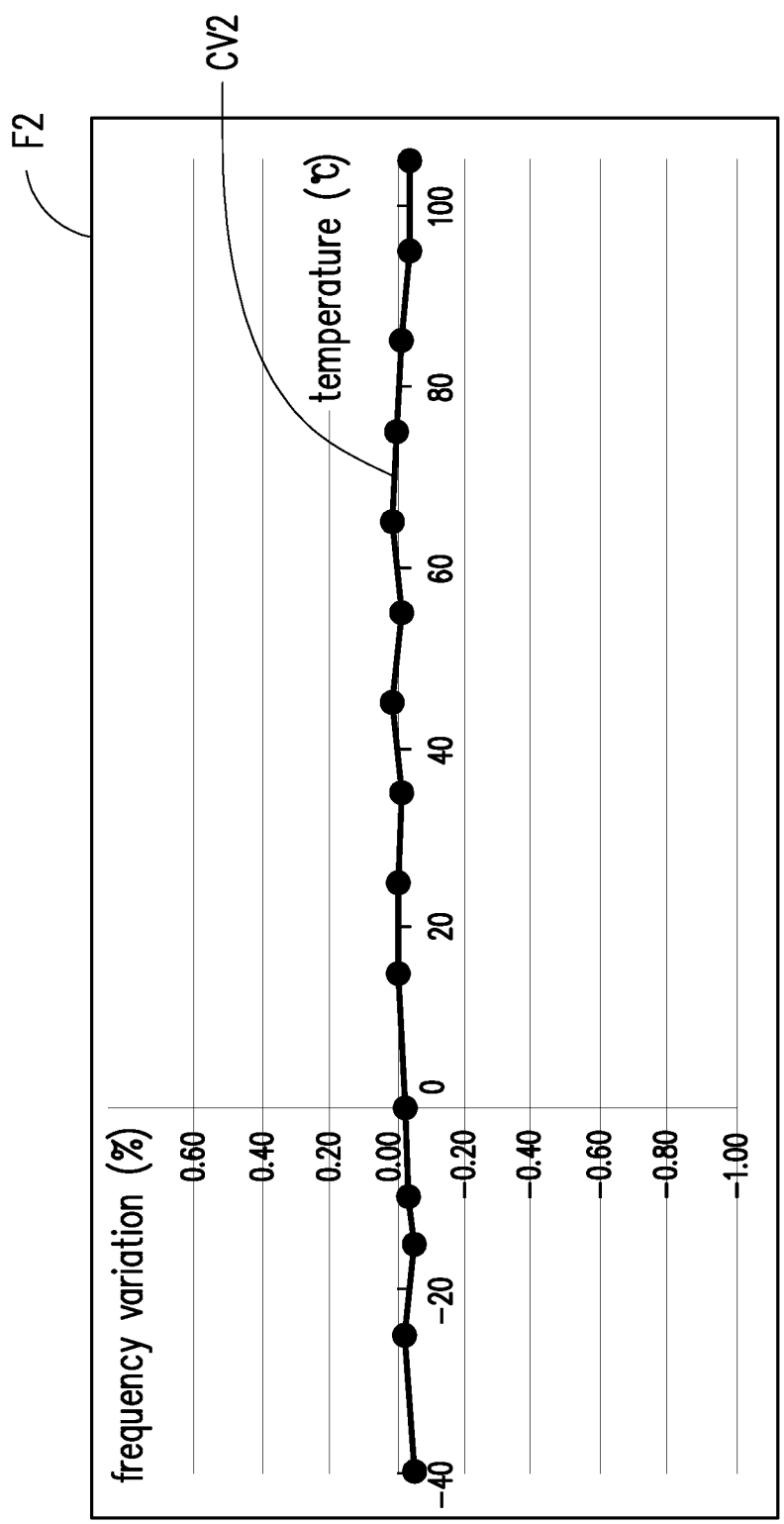
FIG. 5 is an improvement result according to an embodiment of the invention.

Please refer to FIG. 1 and FIG. 5 at the same time. FIG. 5 is an improvement result according to an embodiment of the invention. The horizontal axis in the relationship diagram F2 is illustrated as temperature. The vertical axis in the relationship diagram F2 is illustrated as the relative change in the clock frequency. The relative change in clock frequency is illustrated as a percentage. It can be acquired from a relative curve CV2, in the temperature range of −40° C. to 100° C., the clock frequency is almost unvaried. It is thus indicated that when the variation of the reference voltage VREF is equal to the variation of the first delay voltage VD1 and the second delay voltage VD2, the frequency of the first clock CLK1 and the second clock CLK2 does not vary due to a variation in temperature.

In view of the above, in the temperature compensated oscillation circuit of the invention, the first order term of the temperature change function of the first reference resistance value of the first delay voltage generator and the second delay voltage generator are eliminated. The first order term of the temperature change function of the first reference resistance value is set to equal to the first order term of the temperature change function of the second reference resistance value. Besides, the second resistance value is adjusted such that the variation of the reference voltage matches the second order term of the temperature change function of the first resistance value. The variation of the first delay voltage and the second delay voltage varies due to the second order term of the temperature change function of the first resistance value. Therefore, the variation of the reference voltage is equal to the variation of the first delay voltage and second delay voltage. As such, the clock frequency of the first clock and the second clock does not vary due to a variation in temperature.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A temperature compensated oscillation circuit, comprising:
   a first delay voltage generator, configured to generate a first delay voltage according to a first clock, a first resistance value and a first capacitance value, wherein a first order term of a temperature change function of the first resistance value is eliminated;
   a second delay voltage generator, configured to generate a second delay voltage according to a second clock, the first resistance value and a second capacitance value;
   a reference voltage generator, configured to receive an external power supply, dividing the external power supply to generate a reference voltage according to the first resistance value and a second resistance value, wherein the first order term of a temperature change function of the first reference resistance value is set to be equal to a first order term of a temperature change function of the second reference resistance value, wherein the second resistance value is adjusted, such that variation of the reference voltage matches a second order term of the temperature change function of the first resistance value; and
   a clock generating circuit, coupled to the first delay voltage generator, the second delay voltage generator and the reference voltage generator, configured to generate the first clock according to the first delay voltage and the reference voltage, and generate the second clock according to the second delay voltage and the reference voltage.

2. The temperature compensated oscillation circuit according to claim 1, wherein the first delay voltage generator comprises:
   a first resistor, a first terminal of the first resistor configured to receive an input voltage;
   a second resistor, a first terminal of the second resistor coupled to a second terminal of the first resistor, wherein the first resistor and the second resistor commonly provide the first resistance value;
   a first capacitor, a first terminal of the first capacitor coupled to a second terminal of the second resistor, a second terminal of the first capacitor coupled to a reference low voltage, configured to provide the first capacitance value; and
   a first switch, a first terminal of the first switch coupled to a second terminal of the second resistor and a first terminal of the first capacitor, a second terminal of the first switch coupled to the reference low voltage, a control terminal of the first switch configured to receive the first clock, wherein the first delay voltage generator eliminates the first order term of the temperature change function of the first reference resistance value through the first resistor and the second resistor, and provides the first delay voltage through the second resistor and a connection node of the first capacitor.

3. The temperature compensated oscillation circuit according to claim 1, wherein a temperature coefficient of one of the first resistor and the second resistor is a negative temperature coefficient, wherein a temperature coefficient of the other of the first resistor and the second resistor is a positive temperature coefficient.

4. The temperature compensated oscillation circuit according to claim 2, wherein the second delay voltage generator comprises:
  a third resistor, a first terminal of the third resistor configured to receive the input voltage;
  a fourth resistor, a first terminal of the fourth resistor coupled to a second terminal of the third resistor, wherein the third resistor and the fourth resistor commonly provide the first resistance value;
  a second capacitor, a first terminal of the second capacitor coupled to a second terminal of the fourth resistor, a second terminal of the second capacitor coupled to the reference low voltage, configured to provide the second capacitance value; and
  a second switch, a first terminal of the second switch coupled to a second terminal of the fourth resistor and a first terminal of the second capacitor, a second terminal of the second switch coupled to the reference low voltage, a control terminal of the second switch configured to receive the second clock,
  wherein the second delay voltage generator eliminates the first order term of the temperature change function of the first reference resistance value through the third resistor and the fourth resistor, and provides the first delay voltage through the second resistor and a connection node of the second capacitor.

5. The temperature compensated oscillation circuit according to claim 4, wherein a temperature coefficient of one of the third resistor and the fourth resistor is a negative temperature coefficient, wherein a temperature coefficient of the other of the third resistor and the fourth resistor is a positive temperature coefficient.

6. The temperature compensated oscillation circuit according to claim 1, wherein the reference voltage generator comprises:
  a first reference circuit, a first terminal of the first reference circuit configured to receive the external power supply, a second terminal of the first reference circuit coupled to the clock generating circuit, the first reference circuit configured to provide the first resistance value; and
  a second reference circuit, coupled between the first reference circuit and a reference low voltage, the second reference circuit configured to provide the second resistance value.

7. The temperature compensated oscillation circuit according to claim 6, wherein the first reference circuit comprises:
  a first reference resistor, a first terminal of the first reference resistor configured to receive an external power supply; and
  a second reference resistor, a first terminal of the second reference resistor coupled to a second terminal of the first reference resistor, a second terminal of the second reference resistor coupled to the second reference circuit.

8. The temperature compensated oscillation circuit according to claim 7, wherein a temperature coefficient of one of the first reference resistor and the second reference resistor is a negative temperature coefficient, wherein a temperature coefficient of the other of the first reference resistor and the second reference resistor is a positive temperature coefficient.

9. The temperature compensated oscillation circuit according to claim 6, wherein the second reference circuit comprises:
  a plurality of third reference resistors, coupled between the first reference circuit and the reference low voltage, the plurality of third reference resistors serially connected with each other; and
  a plurality of adjusting switches, respectively connected in parallel to at least one of the plurality of third reference resistors,
  wherein the second reference circuit controls the plurality of adjusting switches according to an adjusting signal, so as to adjust the second resistance value.

10. The temperature compensated oscillation circuit according to claim 1, wherein the clock generating circuit comprises:
  a first comparator, a non-inverting input terminal of the first comparator coupled to the reference voltage generator to receive the reference voltage, a non-inverting input terminal of the first comparator coupled to the first delay voltage generator to receive the first delay voltage, the first comparator configured to compare a voltage value of the reference voltage and a voltage value of the first delay voltage to generate a first comparison result;
  a second comparator, a non-inverting input terminal of the second comparator coupled to the reference voltage generator to receive the reference voltage, a non-inverting input terminal of the second comparator coupled to the second delay voltage generator to receive the second delay voltage, the second comparator configured to compare a voltage value of the reference voltage and a voltage value of the second delay voltage to generate a second comparison result; and
  a logic circuit, coupled to the first comparator, the second comparator, the first delay voltage generator and the second delay voltage generator, configured to generate the first clock and the second clock according to the first comparison result and the second comparison result.

* * * * *